United States Patent [19]
Williams et al.

[11] Patent Number: 6,138,177
[45] Date of Patent: Oct. 24, 2000

[54] SYSTEM AND METHOD OF PIN PROGRAMMING AND CONFIGURATION

[75] Inventors: Mark Williams, San Jose; Jay Li, Milpitas, both of Calif.

[73] Assignee: OPTi Inc., Santa Clara, Calif.

[21] Appl. No.: 09/000,585

[22] Filed: Dec. 30, 1997

Related U.S. Application Data

[60] Provisional application No. 60/033,802, Dec. 31, 1996.

[51] Int. Cl.[7] ........................................................ G06F 3/00
[52] U.S. Cl. .................................. 710/8; 710/11; 710/12; 710/62; 326/37
[58] Field of Search ............................... 710/8, 9, 12, 62, 710/36, 38, 11; 326/37, 38, 39

[56] References Cited

U.S. PATENT DOCUMENTS

| | | | |
|---|---|---|---|
| 5,168,177 | 12/1992 | Shankar et al. | 326/37 |
| 5,317,211 | 5/1994 | Tang et al. | 326/39 |
| 5,511,182 | 4/1996 | Le et al. | 713/600 |
| 5,615,344 | 3/1997 | Corder | 710/129 |
| 5,617,040 | 4/1997 | Matthews | 326/38 |
| 5,717,695 | 2/1998 | Manela et al. | 371/21.1 |
| 5,732,207 | 3/1998 | Allen et al. | 714/5 |
| 5,878,279 | 3/1999 | Athenes | 710/40 |

FOREIGN PATENT DOCUMENTS 54-83341 7/1979 Japan .............................. G06F 7/00

*Primary Examiner*—Ario Etienne
*Attorney, Agent, or Firm*—Fliesler, Dubb, Meyer & Lovejoy LLP

[57] ABSTRACT

A system in accordance with the invention provides a chipset for use generally in a PC-type system and that includes a plurality of programmable I/O (PIO) pins. Each of the PIO pins can be programmed to carry signals in accordance with any function in a function pool. In one embodiment, the number of PIO pins total 32 and the number of functions total 70. Such programmability allows a single-chip chipset to be vendor platform-generic while simultaneously minimizing pin count.

7 Claims, 4 Drawing Sheets

FIG. 3

SYSTEM AND METHOD OF PIN PROGRAMMING AND CONFIGURATION

CROSS-REFERENCE TO RELATED APPLICATIONS

This application claims the benefit of U.S. Provisional Application No. 60/033,802, filed Dec. 31, 1996, and which is incorporated by reference in its entirety herein.

FIELD OF THE INVENTION

The invention relates to pin programming in chipsets used in PC-type systems.

BACKGROUND OF THE INVENTION

The IBM PC AT computer architecture has become industry standard architecture for personal computers, and is typically built around a CPU such as an 80286, 80386, 80486, or 80586 (Pentium ®) microprocessor all manufactured by Intel Corporation. The CPU is coupled to a host (local) bus, capable of performing memory accesses and data transfers at high rates of speed (i.e., on the order of 10–66 MHz). The host bus generally includes 16, 32, or 64 data lines, a plurality of address lines, and various control/status lines.

The typical IBM PC AT-compatible computer also includes a system bus, sometimes referred to as an I/O bus. Such a system bus is used to interface communications between a host CPU and a peripheral device, or communications between peripheral devices and host memory. The system bus is coupled to the host bus via certain interface circuitry. The system bus includes generally 8, 16, or 32 data lines, a plurality of address lines, as well as control/status lines. Commonly used system busses include the PCI bus and the ISA bus, both well known in the art.

Also in recent years, and particularly with the growing popularity of notebook and laptop computers, efforts have been made to reduce the size and improve the manufacturability of PC AT-compatible computers. Specifically, several manufacturers have developed "chipsets", which integrate a large amount of the system interface circuitry and other circuitry onto only a few chips. Examples of a chipset used in a notebook computer is Viper-N™ produced by OPTi, Inc. of Milpitas, Calif. The interface circuitry integrated into chip sets often includes interface circuitry between the host bus and the ISA bus and/or the PCI bus. In efforts to reduce system hardware, as many computer system functions as possible are sought to be incorporated into a chipset.

Generally chipsets are composed of multiple chips, where chipset functionality is partitioned among the chips. For instance, one chip might perform DMA control, where another chip might perform IDE control.

While chipsets are often used in laptop systems, the signals required to be provided by a chipset often vary from vendor to vendor. Thus, chipset manufacturers are often forced to either design a chipset specific to each vendor or to provide a chipset which provide signals that support all vendors, i.e., make a more generic chipset. Typically, in such "generic" chipsets, pins are provided for all signals anticipated to be required by all vendors. Thus, in actual implementation by respective vendors, some signals will not be used and pins will be wasted.

One of the general trends in the computer industry is to make laptops and other PC-type computers smaller and lighter. Thus, any way to scale down chipsets in size, including pin count, is desirable.

SUMMARY OF THE INVENTION

In order to provide a system that furthers the industry trend in reducing PC-type system size reduction, a system in accordance with one embodiment of the invention is a single-chip chipset. Because pins are at a premium in such a single chip chipset, a plurality of programmable I/O pins (PIO pins) are provided and, in one embodiment, total 32 PIO pins. Each PIO pin can be selectively programmed to carry signals in accordance with any of a plurality of functions in a function pool. In one embodiment, the number of functions in the function pool total 70 functions.

A system in accordance with the invention can be used in a variety of vendor platforms. Nonetheless, although generic, a system in accordance with the invention minimizes pins that will be unused by any particular vendor. Thus, costs for producing the chipset will be reduced in terms of both financial resources and pin resources.

BRIEF DESCRIPTION OF THE DRAWINGS

The present invention is described with respect to particular exemplary embodiments thereof and reference is accordingly made to the drawings (which are not necessarily drawn to scale), in which:

FIG. 3 shows a pin diagram of one embodiment of the invention utilizing a ball grid array configuration.

DETAILED DESCRIPTION

As it is desirable in the industry to scale down laptop and other PC-type system hardware, a system in accordance with the invention provides a one-chip chipset solution, unlike traditional chipsets. Nonetheless, although one-chip is used in one embodiment of the present invention to provide the functionality found in several chips in traditional chipsets, pin count will be reduced when using a single chip chipset (i.e., when using one chip as opposed to three or four chips, fewer pins will be available). Thus, pins are at a premium in a single chip chipset.

A system in accordance with the invention has thus devised a way to program certain pins to take on any of a plurality of functions, which may be more than 70 in one embodiment, so that the chip is essentially generic and can be varied platform to platform, but also so that pins that will not be used by all vendors are minimized. Such programmability was unnecessary in traditional chipset solutions as an abundance of pins were available.

Figure 1:
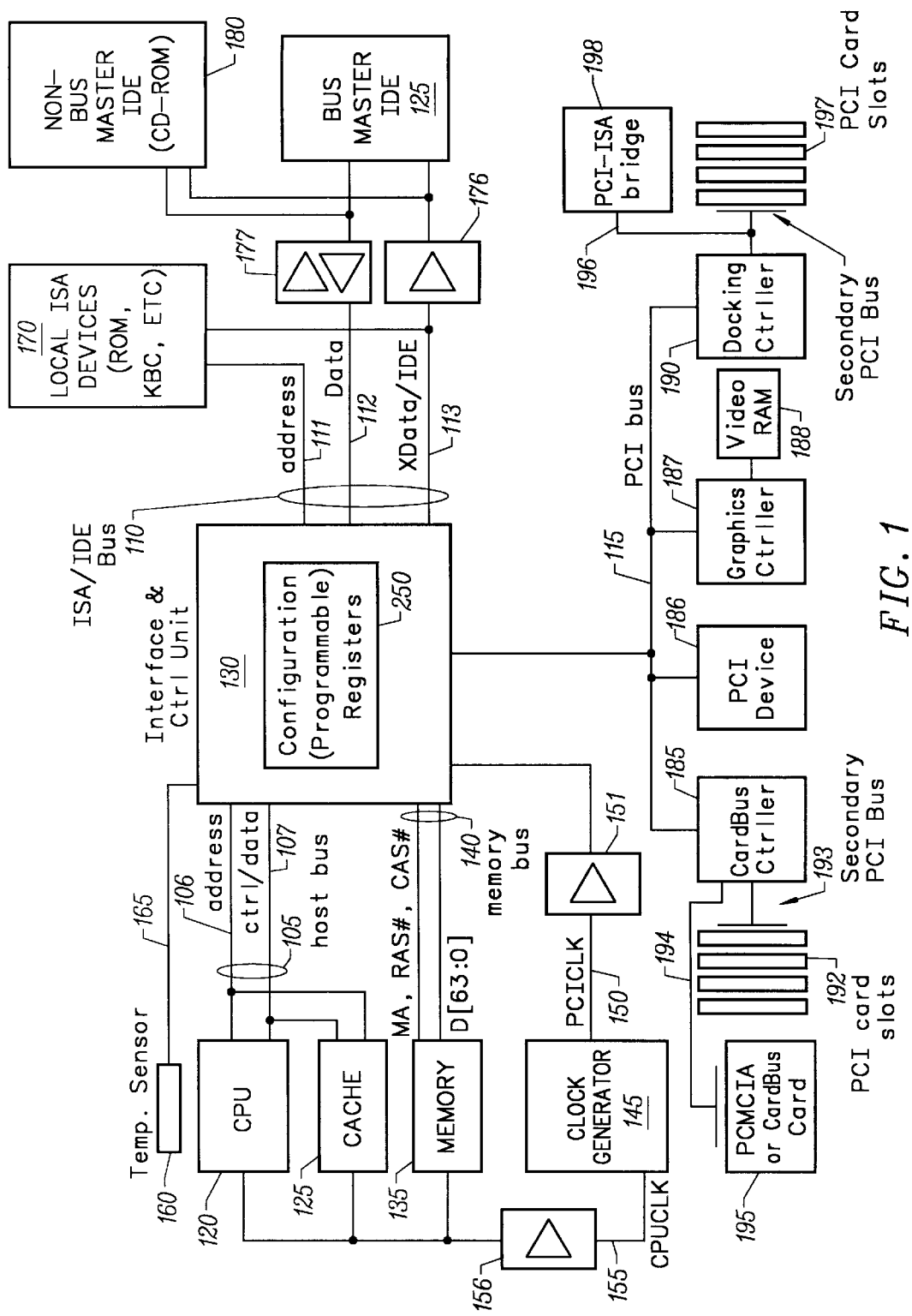
FIG. 1 is a generalized block diagram of a system which utilizes an embodiment of the invention.

A system 100 which may incorporate the present invention is shown in FIG. 1. It comprises a host bus 105, an ISA bus 110, and a primary PCI bus 115.

The host bus 105 includes address lines 106 and control/data/status lines 107. The ISA bus 110 includes address lines 111, 16-bit data lines 112, XData lines 113, as well as various control/status lines (not shown). The primary PCI bus 115, includes address, data and control/status lines.

A processor 120 (such as Intel's 80586 Pentium®) is coupled to address, data and control/status lines of host bus 105. The address and control lines of host bus 105 are further coupled to cache memory 125. Cache memory 125 may be synchronous L2 (level 2) cache in one embodiment.

Host bus 105 is further coupled to interface and control unit 130. In one embodiment interface and control unit 130 is a chipset. Interface and control unit 130 includes programmable registers 250.

Interface and control unit 130 is coupled to memory unit 135 via memory bus 140 which provides memory address, RAS#, CAS#, and data information between interface and control unit 130 and memory unit 135. Memory unit 135 may be composed of EDO or synchronous DRAM in various embodiments.

Clock generator unit 145 provides a PCI clock signal (PCICLK) on line 150 via buffer 151 to interface and control unit 130. Clock generator unit 145 further provides a processor clock signal (CPUCLK) on line 155 via buffer 156 to memory unit 135 (if synchronous DRAM is used) and to processor 120.

Temperature sensor circuit 160 is coupled to interface and control unit 130 via line 165.

Several devices are coupled to interface and control unit 130 via ISA bus 110. These devices include local ISA devices 170, such as BIOS ROM, keyboard controller (KBC), etc. Further, bus mastering IDE devices 175 as well as IDEs 180 which are incapable of a bus-master mode of operation (such as CD-ROM drives) are coupled to interface and control unit via ISA bus 110, buffer 176 and bidirectional transceiver 177.

PCI bus 115 is also coupled to interface and control unit 130. Several devices are coupled to PCI bus 115, including a cardbus controller 185, which may be an 82C824 produced by OPTi, Inc. of Milpitas, Calif., a graphics controller 187, which may be a 92C178, produced by OPTi, Inc., and a docking controller 190, which may be an 82C814 produced by OPTi, Inc. Coupled to graphics controller 187 is video RAM card 188. Other PCI devices 186, such as a PCI-based super I/O unit, may also be coupled to PCI bus 115. Other embodiments may utilize different PCI devices from those of FIG. 1.

CardBus controller 185 acts as a bridge to secondary PCI buses 193 and 194. Secondary PCI buses 193 and 194 couple PCMCIA or other CardBus cards 192 and 195 to the system.

In like manner, docking controller 190 is coupled to a secondary PCI bus 196, which couples additional PCI slots 197 to the system. In one embodiment of the invention, docking controller 190 is further coupled to a PCI-to-ISA bridge 198 in one embodiment of the invention.

Figure 2:
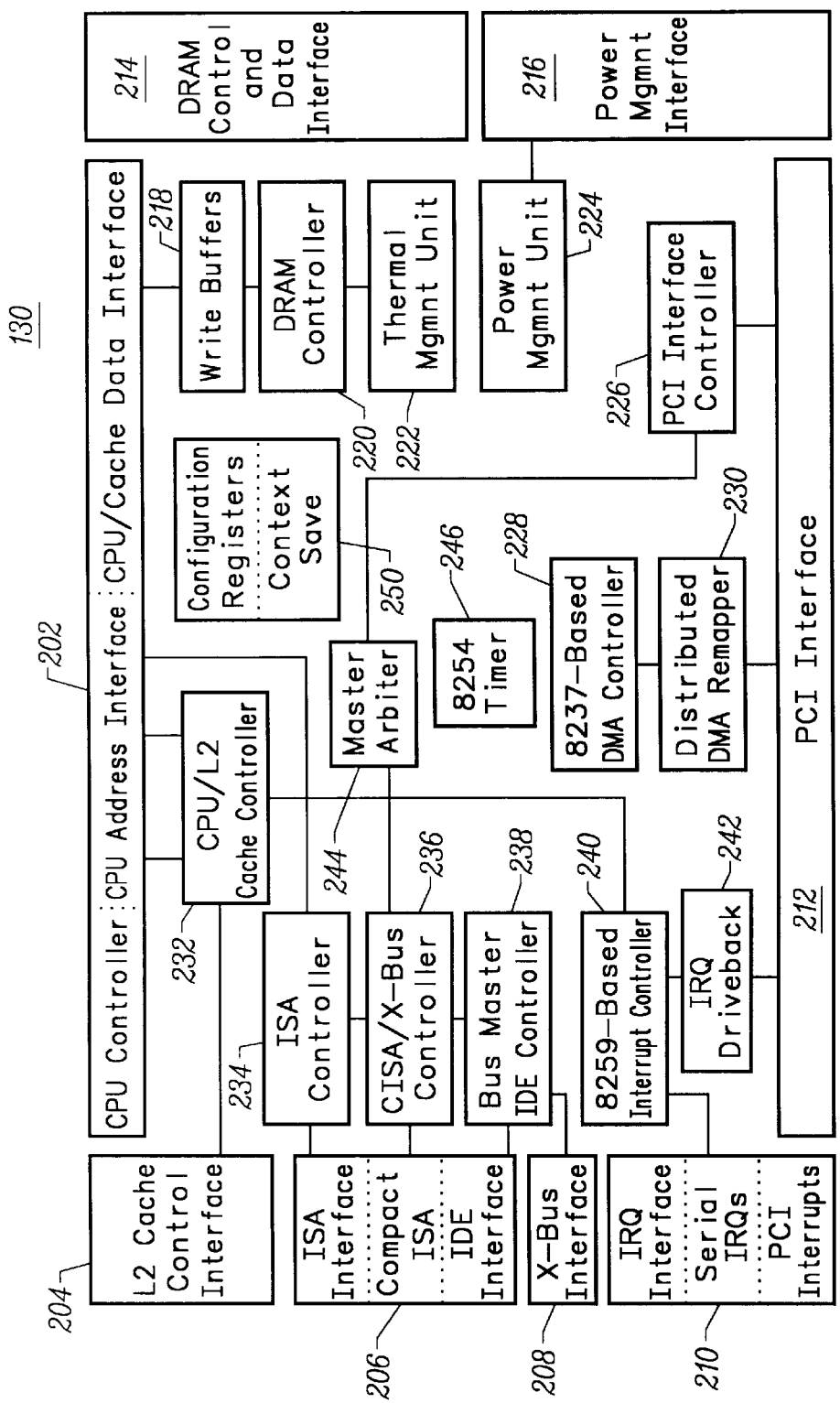
FIG. 2 is a functional block diagram of the logic modules, including configuration registers 250, of one embodiment of the invention.

Referring to FIG. 2, interface and control unit 130 is shown partitioned into various logic modules. The logic modules include a number of interfaces such as CPU interface 202, cache control interface 204, ISA/IDE interface 206, X-bus interface 208, interrupt interface 210, PCI interface 212, DRAM control and data interface 214, and power management interface 216.

CPU interface 202 includes a CPU/cache data interface, a CPU address interface, and a CPU controller. The CPU/cache data interface is coupled to write buffers 218. Write buffers 218 are coupled to DRAM controller 220 which in turn is coupled to thermal management unit 222. The CPU address interface portion of the CPU interface 202 is coupled to the CPU/L2 cache controller 232 which in turn is coupled to the CPU controller and the L2 cache control interface 204. CPU/L2 cache controller 232 is further coupled to interrupt controller 240, which is coupled to the interrupt interface 210.

CPU interface 202 is further coupled to an ISA controller 234. A compact ISA/X-bus controller 236 is coupled to the ISA controller. Bus master IDE controller 238 is also coupled to the compact ISA/X-bus controller 236. Each of the ISA controller 234, the compact ISA/X-bus controller 236, and the bus master IDE controller 238 are coupled to the ISA/IDE interface 206. The bus master IDE controller 238 is also coupled to the X-bus interface 208.

The PCI interface 212 is coupled to IRQ driveback unit 242, which in turn is coupled to the interrupt controller 240. PCI interface 212 is further coupled to distributed DMA remapper 230, which is turn is coupled to DMA controller 228. PCI interface 212 is further coupled to PCI interface controller 226, which in turn is coupled to a master arbiter 244, also coupled to the compact ISA/X-bus controller 236.

The power management unit 224 is coupled to the power management interface 216. Also included in the logic modules is a timer unit 246. Finally, configuration registers 250 are included in the logic modules.

Figure 3:
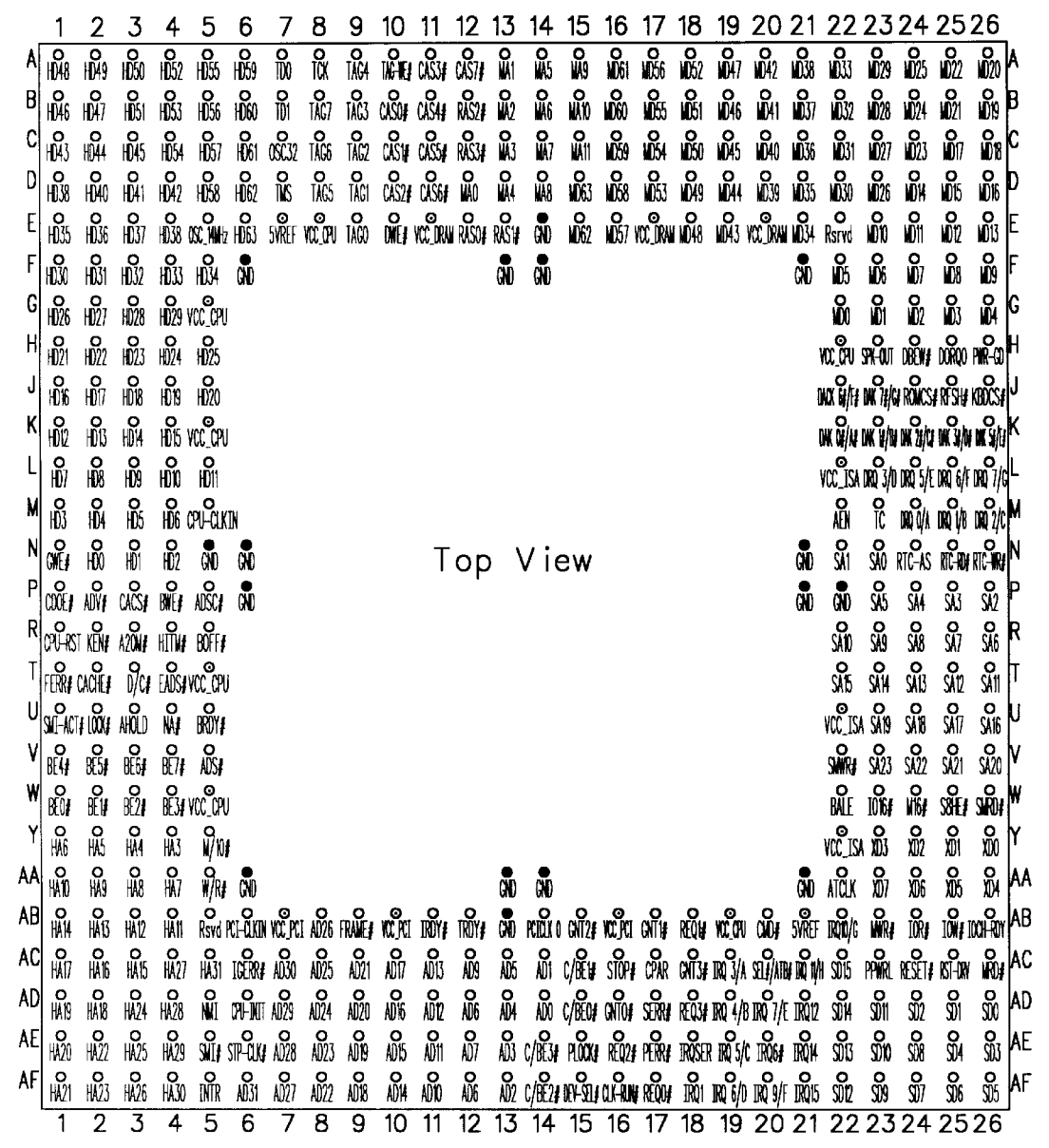

FIG. 3 shows a pin diagram of one embodiment of the invention implemented in a ball grid array (BGA). The signals shown in the embodiment of FIG. 3 are described in further detail in Table 1 below. In Table 1, "Firestar" refers to one commercial embodiment of the invention produced by OPTi, Inc. of Milpitas, Calif. Also in Table 1, the category "Selected by" is generally used when a signal on the pin is selectable and/or programmable. References are made in the "Selected by" category often to registers entitled "SYSCFG" and "PCIDV1". Other registers and selection mechanisms are also referred to in the "Selected by" category.

TABLE 1

| Signal Name | Pin No. | Signal Type (Drive) | Selected By | Signal Description |
|---|---|---|---|---|
| Signal Descriptions ||||||
| CPU Interface Signals Set ||||||
| Host Data Bus | | | | |
| HD[63:0] | E6, D6, C6, B6, A6, D5, C5, B5, A5, C4, B4, A4, B3, A3, A2, A1, B2, B1, C3:C1, D4:D1, E4:E1, F5:F1, | I/O (4mA) | | Host Data Bus Lines 63 through 0: Provides a 64-bit data path to the CPU. |

TABLE 1-continued

Signal Descriptions

| Signal Name | Pin No. | Signal Type (Drive) | Selected By | Signal Description |
|---|---|---|---|---|
| | G4:G1, H5:H1, J5:J1, K4:K1, L5:L1, M4:M1, N4:N2 | | | |
| CPU Address | | | | |
| HA[31:3] | AC5, AF4, AE4, AD4, AC4, AF3, AE3, AD3, AF2, AE2, AF1, AE1, AD1, AD2, AC2, AC1:AC3, AB1:AB4, AA1:AA4, Y1:Y4 | I/O (4mA) | | Host Address Bus Lines 31 through 3: HA[31:3] are the address lines of the CPU bus. HA[31:3] are connected to the CPU A[31:3] lines. Along with the byte enable signals, the HA[31:3] lines define the physical area of memory or I/O being accessed. During CPU cycles, the HA[31:3] lines are inputs. They are used for address decoding and second level cache tag lookup sequences. During inquire cycles, the HA[31:5] lines are outputs to the CPU to snoop the first level cache tags. They also are outputs to the L2 cache. HA[31:3] have internal pull-downs, however, external pull-ups are required on HA3 and HA4. |
| BE[7:0]# | V4:V1, W4:W1 | I | | Byte Enables 7 through 0: Selects the active byte lanes on HD[63:0]. |
| NMI | AD5 | O (4mA) | | Non-Maskable Interrupt: This signal is activated when a parity error from a local memory read is detected or when the IOCHK# signal from the ISA bus is asserted and the corresponding control bit in Port B is also enabled. |
| INTR | AF5 | O (4mA) | | Interrupt Request: INTR is driven to signal the CPU that an interrupt request is pending and needs to be serviced. The interrupt controller must be programmed following a reset to ensure that INTR is at a known state. |
| FERR# | T1 | I | | Floating Point Coprocessor Error: This input causes two operations to oocur. IRQ 13 is triggered and IGERR# is enabled. An I/O write to Port F0h will set IGERR# low when FERR# is low. |
| IGERR# | AC6 | I/O (4mA) | | Ignore Coprocessor Error: Normally high, IGERR# will go low after FERR# goes low and an I/O write to Port 0F0h occurs. When FERR# goes high, IGERR# is driven high. |
| CPU Control/Status | | | | |
| M/IO# | Y5 | I | | Memory/Input-Output: M/IO#, D/C#, and W/R# define CPU bus cycles. Interrupt acknowledge cycles are forwarded to the PCI bus as PCI interrupt acknowledge cycles. All I/O cycles and any memory cycles that are not directed to memory controlled by the DRAM interface are forwarded to PCI. |
| D/C# | T3 | I | | Data/Control: D/C#, M/IO#, and W/R# define CPU bus cycles. (See M/IO# definition above.) |
| W/R# | AA5 | I/O | | Write/Read: W/R#, D/C#, and M/IO# define CPU bus cycles. (See M/IO# definition above.) |
| ADS# | V5 | I | | Address Strobe: The CPU asserts ADS# to indicate that a new bus cycle is beginning. ADS# is driven active in the same clock as the address, byte enables, and cycle definiton signals. ADS# has an internal pull-up resistor that is disabled when the system is in the Suspend mode. |
| BRDY# | U5 | O (4mA) | | Burst Ready: BRDY# indicates that the system has responded in one of three ways: 1) Valid data has been placed on the CPU data bus in response to a read, 2) CPU write data has been accepted by the system, or 3) the system has responded to a special cycle. |
| NA# | U4 | O (4mA) | | Next Address: This signal is connected to the CPU's NA# pin to request pipelined addessing for local memory cycle. FireStar asserts NA# for one clock when the system is ready to accept a new address from the CPU, even if all data transfers for the current cycle have not completed. The 3.3V Pentium processor and the M1 processor support pipelined memory accesses, however, the K5 processor does not support this feature. |

TABLE 1-continued

Signal Descriptions

| Signal Name | Pin No. | Signal Type (Drive) | Selected By | Signal Description |
|---|---|---|---|---|
| KEN# | R2 | O (4mA) | | Cache Enable: This pin is connected to the KEN# input of the CPU and is used to determine whether the current cycle is cacheable. |
| EADS# | T4 | O (4mA) | | External Address Strobe: This output indicates that a valid address has been driven onto the CPU address bus by an external device. This address will be used to perform an internal cache inquiry cycle when the CPU samples EADS# active. |
| HITM# | R4 | I | | Hit Modified: Indicates that the CPU has had a hit on a modified line in its internal cache during an inquire cycle. It is used to prepare for writeback. |
| CACHE# | T2 | I | | Cacheability: This input is connected to the CACHE# pin of the CPU. It goes active during a CPU initiated cycle to indicate when, an internal cacheable read cycle or a burst writeback cycle, occurs. |
| AHOLD | U3 | O (4mA) | | Address Hold: This signal is used to tristate the CPU address bus for internal cache snooping. |
| LOCK# | U2 | I | | CPU Bus Lock: The processor asserts LOCK# to indicate the current bus cycle is locked. It is used to generate PLOCK# for the PCI bus. LOCK# has an internal pull-down resistor that is engaged when HLDA is active. |
| BOFF# | R5 | O (4mA) | | Back-off: This pin is connected to the BOFF# input of the CPU. This signal is asserted during PCI/retry cycles. |
| CPURST | R1 | O (4mA) | (Always) | CPU Reset: This signal generates a hard reset to the CPU whenever the PWRGD input goes active. |
| RSMRST | | | SYSCFG ADh[5] = 1 | Resume Reset: Generates a hard reset to the CPU on resuming from Suspend mode. |
| Host Power Control | | | | |
| SMI# | AE5 | O (4mA) | | System Management Interrupt: This signal is used to request System Management Mode (SMM) operation. |
| SMIACT# | U1 | I | | System Management Interrupt Active: The CPU asserts SMIACT# in response to the SMI# signal to indicate that it is operating in System Management Mode (SMM). |
| STPCLK# | AE6 | O | | Stop Clock: This signal is connected to the STPCLK# input of the CPU. It causes the CPU to get into the STPGNT# state. |
| L2 Cache Control | | | | |
| CDOE# | P1 | O (4mA) | | Cache Output Enable: This signal is connected to the output enables of the SRAMs of the L2 cache in both banks to enable data read. |
| CACS# | P3 | O (4mA) | SYSCFG 16h[5] = 1 (Default) | Cache Chip Select: This pin is connected to the chip selects of the SRAMs in the L2 cache to enable data read/write operations. If not used, the CS# lines of the cache should be tied low. |
| DIRTY | | | SYSCFG 16h[5] = 0 | Tag Dirty Bit: This separate dirty bit allows the tag data to be 8 bits wide instead of 7. |
| BWE# | P4 | O (4mA) | SYSCFG 19h[3] = 0 | Byte Write Enable: Write command to L2 cache indicating that only bytes selected by BE[7:0]# will be written. |
| RAS4# | | | SYSCFG 19h[3] = 1 | Row Address Strobe Bit 4: Each RAS# signal corresponds to a unique DRAM bank. Depending on the kind of DRAM modules being used, this signal may or may not need to be buffered externally. This signal, however, should be connected to the corresponding DRAM RAS# line through a damping resistor. |
| GWE# | N1 | O (4mA) | SYSCFG 19h[7] = 0 | Global Write Enable: Write command to L2 cache indicating that all bytes will be written. |
| RAS5# | | | SYSCFG 19h[7] = 1 | Row Address Strobe Bit 5: Each RAS# signal corresponds to a unique DRAM bank. Depending on the kind of DRAM modules being used, this signal may or may not need to be buffered externally. This signal, however, should be connected to the corresponding DRAM RAS# line through a damping resistor. |
| TAG0 | E9 | I/O (4mA) | | Tag RAM Data Bit 0: This input signal becomes an output whenever TAGWE# is activated to write a new tag to the Tag RAM. |
| TAG1 | D9 | I/O | SYSCFG 00h[5] = 0 | Tag RAM Data Bit 1: This input signal becomes an output whenever TAGWE# is activated to write a new tag to the Tag RAM. |

TABLE 1-continued

Signal Descriptions

| Signal Name | Pin No. | Signal Type (Drive) | Selected By | Signal Description |
|---|---|---|---|---|
| START# | | | SYSCFG 00h[5] = 1 | Start: If using the Sony cache module, then this pin is connected to the START# output from the Sony SONIC2-WP module. If using the Sony cache module, then TAG1 and TAG2 are connected to the START# output from the module and TAG3 is connected to the BOFF# output from the module. The remaining TAG bits are unused. |
| TAG2 | C9 | I/O (4mA) | SYSCFG 00h[5] = 0 | Tag RAM Data Bit 2: This input signal becomes an output whenever TAGWE# is activated to write a new tag to the Tag RAM. |
| START# | | | SYSCFG 00h[5] = 1 | Start: If using the Sony cache module, then this pin is connected to the START# output from the Sony SONIC2-WP module. If using the Sony cache module, then TAG1 and TAG2 are connected to the START# output from the module and TAG3 is connected to the BOFF# output from the module. The remaining TAG bits are unused |
| TAG3 | B9 | I/O (4mA) | SYSCFG 00h[5] = 0 | Tag RAM Data Bit 3: This input signal becomes an output whenever TAGWE# is activated to write a new tag to the Tag RAM. |
| SBOFF# | | | SYSCFG 00h[5] = 1 | Sony Back-off: For use with Sony SONIC-2WP cache module. |
| TAG4 | A9 | I/O (4mA) | | Tag RAM Data Bit 4: This input signal becomes an output whenever TAGWE# is activated to write a new tag to the Tag RAM. |
| TAG5 | D8 | I/O (4mA) | | Tag RAM Data Bit 5: This input signal becomes an output whenever TAGWE# is activated to write a new tag to the Tag RAM. |
| TAG6 | C8 | I/O (4mA) | | Tag RAM Data Bit 6: This input signal becomes an output whenever TAGWE# is activated to write a new tag to the Tag RAM. |
| TAG7 | B8 | I/O (4mA) | | Tag RAM Data Bit 7: This input signal becomes an output whenever TAGWE# is activated to write a new tag to the Tag RAM. |
| TAGWE# | A10 | I/O (4mA) | PCIDV1 81h = 00h | Tag RAM Write Enable: This control strobe is used to update the Tag RAM with the valid tag of the new cache line that replaces the current one during external cache read miss cycles. |
| PIO1 | | | PCIDV1 81h ≠ 00h | Programmable Input/Output 1 |
| ADSC# | P5 | I/O (4mA) | PCIDV1 82h = 00h | Controller Address Strobe: For a synchronous L2 cache operation, this pin is connected to the ADSC# input of the synchronous SRAMs. |
| PIO2 | | | PCIDV1 82h ≠ 00h | Programmable Input/Output 2 |
| ADV# | P2 | I/O (4mA) | PCIDV1 83h = 00h | Advance Output: For synchronous cache L2 operation, this pin becomes the advance output and is connected to the ADV# input of the synchronous SRAMs. |
| PIO3 | | | PCIDV1 83h ≠ 00h | Programmable Input/Output 3 |
| DRAM and PCI Interface Signals Set | | | | |
| DRAM Interface | | | | |
| RAS0# | E12 | O (8/12mA) | | Row Address Strobe 0: Each RAS# signal corresponds to a unique DRAM bank. Depending on the kind of DRAM modules being used, this signal may or may not need to be buffered externally. This signal, however, should be connected to the corresponding DRAM RAS# line through a damping resistor. |
| RAS1# | E13 | O (8/12mA) | PCIDV1 85h = 00h | Row Address Strobe 1: Refer to RAS0# signal description. |
| PIO5 | | I/O | PCIDV1 85h ≠ 00h | Programmable Input/Output 5 |
| RAS2# | B12 | O (8/12mA) | PCIDV1 84h = 00h | Row Address Strobe 2: Refer to RAS0# signal description. |
| PIO4 | | I/O | PCIDV1 84h ≠ 00h | Programmable Input/Output 4 |
| RAS3# | C12 | O (8/12mA) | | Row Address Strobe 3: Refer to RAS0# signal description. |
| MA12 | | | | Memory Address Bus Line 12 |
| CAS0-7# | B10, C10, D10, A11, B11, C11, | O (8mA) | | Column Address Strobe Lines 0 through 7: The CAS0-7# outputs correspond to the eight bytes for each DRAM bank. Each DRAM bank has a 64-bit data bus. |

TABLE 1-continued

Signal Descriptions

| Signal Name | Pin No. | Signal Type (Drive) | Selected By | Signal Description |
|---|---|---|---|---|
| | D11, A12 | | | These signals are typically connected directly to the DRAM's CAS# inputs through a damping resistor. |
| DWE# | E10 | O (8mA) | | DRAM Write Enable: This signal is the common write enable for all 64 bits of DRAM if either fast page mode or EDO DRAMs are used. This signal can be buffered externally before connection to the WE# input of the DRAMs. |
| MA[11:0] | C15, B15, A15, D14, C14, B14, A14, D13, C13, B13, A13, D12 | O (8/12mA) | | Memory Address Bus Lines 11 through 0: Multiplexed row/column address lines to the DRAMs. Depending on the kind of DRAM modules being used, these signals may or may not need to be buffered externally. MA12 is optionally available instead of RAS3#. |
| MD[63:32] | D15, E15, A16, B16, C16, D16, E16, A17, B17, C17, D17, A18, B18, C18, D18, E18, A19, B19, C19, D19, E19, A20, B20, C20, D20, A21, B21, C21, D21, E21, A22, B22 | I/O (4mA) | | Higher Order Memory Data Bus: These pins are connected directly to the higher order DRAM data bus. |
| MD[31:0] | C22, D22, A23, B23, C23, D23, A24, B24, C24, A25, B25, A26, B26, C26, C25, D26, D25, D24, E26, E25, E24, E23, F26, F25, F24, F23, F22, G26, G25, G24, G23, G22 | I/O (4mA) | | Lower Order Memory Data Bus: These pins are connected directly to the lower order DRAM data bus. |
| PCI Bus Interface | | | | |
| AD[31:0] | AF6, AC7, AD7, AE7, AF7, AB8, AC8, AD8, AE8, AF8, AC9, AD9, AE9, AF9, AC10, AD10, AE10, AF10, AC11, AD11, AE11, AF11, AC12, AD12, AE12, AF12, AC13, AD13, AE13, AF13, AC14, AD14 | I/O (PCI) | | PCI Address and Data: AD[31:0] are bidirectional address and data lines for the PCI bus. The AD[31:0] signals sample or drive the address and data on the PCI bus. |
| C/BE[3:0]# | AE14, AF14, | I/O (PCI) | | PCI Bus Command and Byte Enables: During the address phase of a transaction, C/BE[3:0]# define the |

TABLE 1-continued

Signal Descriptions

| Signal Name | Pin No. | Signal Type (Drive) | Selected By | Signal Description |
|---|---|---|---|---|
| | AC15, AD15 | | | PCI command. During the data phase, C/BE[3:0]# are used as the PCI byte enables. The PCI commands indicate the current cycle type, and the PCI byte enables indicate which byte lanes carry meaningful data. FireStar drives C/BE[3:0]# as an initiator of a PCI bus cycle and monitors C/BE[3:0]# as a target. |
| CPAR | AC17 | I/O (PCI) | | Calculated Parity Signal: PAR is "even" parity and is calculated on 36 bits - AD[31:0] plus C/BE[3:0]#. PAR is generated for address and data phases and is only guaranteed to be valid on the PCI clock after the corresponding address or data phase. |
| FRAME# | AB9 | I/O (PCI) | | Cycle Frame: FRAME# is driven by the ourrent bus master to indicate the beginning and duration of an access. FRAME# is asserted to indicate that a bus transaction is beginning. FRAME# is an input when FireStar is the target and an output when it is the initiator. |
| IRDY# | AB11 | I/O (PCI) | | Initiator Ready: IRDY# indicates FireStar's ability, as an initiator, to complete the current data phase of the transaction. It is used in conjunction with TRDY#. A data phase is completed on each clock that both IRDY# and TRDY# are sampled asserted. IRDY# is an input to when FireStar is the target and an output when it is the initiator. |
| TRDY# | AB12 | I/O (PCI) | | Target Ready: TRDY# indicates FireStar's ability to complete the current data phase of the transaction. It is used in conjunction with IRDY#. A data phase is completed on each clock that TRDY# and IRDY# are both sampled asserted. TRDY# is an input when FireStar is the initiator and an output when it is the target. |
| DEVSEL# | AF15 | I/O (PCI) | | Device Select: FireStar asserts DEVSEL# to claim a PCI transaction. As an output, FireStar asserts DEVSEL# when it samples configuration cycles to the configuration registers. FireStar also asserts DEVSEL# when an internal IPC address is decoded. As an input, DEVSEL# indicates the response to a transaction. If no slave claims the cycle, FireStar will assert DEVSEL# to terminate the cycle. |
| STOP# | AC16 | I/O (PCI) | | Stop: STOP# indicates that FireStar, as a target, is requesting a master to stop the current transaction. As a master, STOP# causes FireStar to stop the current transaction. STOP# is an output when FireStar is a target and an input when it is the initiator. |
| PLOCK# | AE15 | I/O | | PCI Lock: PLOCK# is used to indicate an atomic operation that may require multiple transactions to complete. When PLOCK# is asserted, non-exclusive transactions may proceed to an address that is not currently locked. Control of PLOCK# is obtained under its own protocol in conjunction with PGNT#. |
| SERR# | AD17 | I/O (PCI) | | System Error: SERR# can be pulsed active by any PCI device that detects a system error condition. Upon sampling SERR# active, FireStar generates a non-maskable interrupt (NMI) to the 3.3V Pentium CPU. |
| PERR# | AE17 | I/O (4mA) | | Parity Error: PERR# may be pulsed by any agent that detects a parity error during an address phase, or by the master, or by the selected target during any data phase in which the AD[31:0] lines are inputs. Upon sampling PERR# active, FireStar generates a non-maskable interrupt (NMI) to the 3.3V Pentium CPU. |
| PCICLKIN | AB6 | I (CPU) | | PCI Clock Input: Master PCI clock input on the CPU power plane. |
| CLKRUN# | AF16 | I/O (PCI) | PCIDV1 86h = 00h | Clock Run: CLKRUN# is an I/O sustained tristate signal and follows the PCI 2.1 defined protocol. When a PCI device pulls CLKRUN# low, FireStar enables PCICLK by asserting CLKOE (PIO option) high. FireStar maintains control of CLKRUN# and will keep it low as long as it intends to keep the clock running. FireStar will attempt to turn off the PCI clock to PCI devices whenever software enables APM Doze mode (setting SYSCFG 50h[3] = 1). Note that the FireStar PCICLK input must not be turned off. A weak external pull-up is required. |
| PIO6 | | | PCIDV1 86h ≠ 00h | Programmable Input/Output 6 |
| REQ0# | AF17 | I | | PCI Bus Request 0: REQ# is used by PCI bus masters to request control of the bus. |

TABLE 1-continued

Signal Descriptions

| Signal Name | Pin No. | Signal Type (Drive) | Selected By | Signal Description |
|---|---|---|---|---|
| GNT0# | AD16 | O (PCI) | | PCI Bus Grant 0: GNT# is returned to PCI bus masters asserting REQ#, when the bus becomes available. |
| REQ1# | AB18 | I | PCIDV1 87h = 00h | PCI Bus Request 1: Refer to REQ0# signal description. |
| PIO7 | | I/O (4mA) | PCIDV1 87h ≠ 00h | Programmable Input/Output 7 |
| PCICLK0 | AB14 | O | | PCI Clock Output 0: This PCI clock output is always available. |
| GNT1# | AB17 | O (PCI) | Default | PCI Bus Grant 1: Refer to GNT0# signal description. |
| PCICLK1 | | O (4mA) | RTCRD# strap option | PCI Clock Output 1 |
| REQ2# | AE16 | I | PCIDV1 88h = 00h | PCI Bus Request 2: Refer to REQ0# signal description. |
| PIO8 | | I/O (4mA) | PCIDV1 88h ≠ 00h | Programmable Input/Output 8 |
| GNT2# | AB15 | O (PCI) | Default | PCI Bus Grant 2: Refer to GNT0# signal description. |
| PCICLK2 | | | RTCWR# strap option | PCI Clock Output 2 |
| REQ3# | AD18 | I | | PCI Bus Request 3: Refer to REQ0# signal description. |
| UMAREQ# | | | TBD | UMA Request |
| GNT3# | AC18 | O (PCI) | | PCI Bus Grant 3: Refer to GNT0# signal description. |
| UMAGNT# | | | TBD | UMA Grant |
| IDE Interface Signal Set | | | | |
| Bus Master IDE Interface | | | | |
| DBEW# | H24 | O (4mA) | Default | Drive W Buffer Control |
| 1DE1_DACK# | | | A20M# strap option | DDACK# for Second IDE Cable |
| DWR# | | | PCIDV1 4Fh[1] = 1 | Drive Write Signal |
| DDRQ0 | H25 | I/O (4mA) | PCIDV1 89h = 00h | Drive Cable A DMA Request |
| PIO9 | | | PCIDV1 89h ≠ 00h | Programmable Input/Output 9 |
| RSTDRV | AC25 | I/O (4mA) | PCIDV1 8Fh = 00h | Reset Drive: Active high reset signal to ISA bus devices. |
| PIO15 | | | PCIDV1 8Fh ≠ 00h | Programmable Input/Output 15 |
| Clock and Reset Interface | | | | |
| RESET# | AC24 | O (8mA) | | System Reset: When asserted, this signal resets the CPU.RESET# is asserted in response to a PWRGD only and is guaranteed to be active for 1ms such that CLK and VCC are stable. |
| PWRGD | H26 | I | | Power Good: This input reflects the "wired-OR" status of the external reset switch and the power good status from the power supply. |
| OSC_14MHZ | E5 | I | | Timer Oscillator Clock: This is the main clock used by the internal 8254 timers. It is connected to a 14.31818MHz oscillator. |
| 32KHZ | C7 | I | | 32KHz Clock: This signal is used as a 32KHz clock input. It is used for power management and is usually the only active clock when the system is in Suspend mode. |
| CPUCLKIN | M5 | I | | Feedback Input to Circuitry: This input clock must be equivalent to, and in phase with, the clock going to the CPU. |
| ISA Interface Signal Set | | | | |
| Interrupt Controller Interface | | | | |
| IRQ1 | AF18 | I | PCIDV1 8Ah = 00h | Interrupt Request 1: Normally connected to the keyboard controller. |
| PIO10 | | I/O (4mA) | PCIDV1 8Ah ≠ 00h | Programmable Input/Output 10 |
| IRQA/IRQ3 | AC19 | I | | Programmable Interrupt Request A/IRQ3: Used as IRQ3 for full ISA support. Can be programmed as only ISA or PCI interrupt through PCIDV1 B0h. |

TABLE 1-continued

Signal Descriptions

| Signal Name | Pin No. | Signal Type (Drive) | Selected By | Signal Description |
|---|---|---|---|---|
| IRQB/IRQ4 | AD19 | I | | Programmable Interrupt Request B/IRQ4: Used as IRQ4 for full ISA support. Can be programmed as only ISA or PCI interrupt through PCIDV1 B1h. |
| IRQC/IRQ5 | AE19 | I | | Programmable Interrupt Request C/IRQ5: Used as IRQ5 for full ISA support. Can be programmed as only ISA or PCI interrupt through PCIDV1 B2h. |
| IRQD/IRQ6 | AF19 | I | | Programmable Interrupt Request D/IRQ6: Used as IRQ6 for full ISA support. Can be programmed as only ISA or PCI interrupt through PCIDV1 B3h. |
| IRQE/IRQ7 | AD20 | I | | Programmable Interrupt Request E/IRQ7: Used as IRQ7 for full ISA support. Can be programmed as only ISA or PCI interrupt through PCIDV1 B4h. |
| IRQ8# | AE20 | I | PCIDV1 8Bh = 00h | Interrupt Request 8: Normally connected to the RTC alarm output. |
| PIO11 | | I/O (4mA) | PCIDV1 8Bh ≠ 00h | Programmable Input/Output 11 |
| IRQF/IRQ9 | AF20 | I | | Programmable Interrupt Request F/IRQ9: Used as IRQ9 for full ISA support. Can be programmed as only ISA or PCI interrupt through PCIDV1 B5h. |
| IRQG/IRQ10 | AB22 | I | | Programmable Interrupt Request G/IRQ10: Used as IRQ10 for full ISA support. Can be programmed as only ISA or PCI interrupt through PCIDV1 B6h. |
| IRQH/IRQ11 | AC21 | I | | Programmable Interrupt Request H/IRQ11: Used as IRQ11 for full ISA support. Can be programmed as only ISA or PCI interrupt through PCIDV1 B7h. |
| IRQ12 | AD21 | I | PCIDV1 8Ch = 00h | Interrupt Request 12: Normally connected to the mouse interrupt from the keyboard controller. |
| PIO12 | | I/O (4mA) | PCIDV1 8Ch ≠ 00h | Programmable Input/Output 12 |
| IRQ14 | AE21 | I | PCIDV1 8Dh = 00h | Interrupt Request 14: Normally connected to the primary IDE channel. |
| PIO13 | | I/O (4mA) | PCIDV1 8Dh ≠ 00h | Programmable Input/Output 13 |
| IRQ15 | AE21 | I | PCIDV1 BBh[0] = 0 | Interrupt Request 15: Normally connected to the secondary IDE channel. |
| SIN# | | | PCIDV1 BBh[0] = 1 | Serial Input: Serial interrupt return line for Intel style of serial IRQs. |
| IRQSER | AE18 | I/O | PCIDV1 BAh[0] = 0 | Serial Interrupt Request: Bidirectional interrupt line for Compaq style of serial IRQs. |
| SOUT# | | O | PCIDV1 BBh[0] = 1 | Serial Output: Serial interrupt output line for Intel style of serial IRQs. |
| ISA DMA Arbiter Interface | | | | |
| DRQA/DRQ0 | M24 | I | PCIDV1 99h = 00h | Programmable DMA Request A/DRQ0: The DREQ is used to request DMA service from the DMA controller. |
| PIO25 | | I/O (4mA) | PCIDV1 99h ≠ 00h | Programmable Input/Output 25 |
| DRQB/DRQ1 | M25 | I | PCIDV1 9Ah = 00h | Programmable DMA Request B/DRQ1 |
| PIO26 | | I/O (4mA) | PCIDV1 9Ah ≠ 00h | Programmable Input/Output 26 |
| DRQC/DRQ2 | M26 | I | PCIDV1 9Bh = 00h | Programmable DMA Request C/DRQ2 |
| PIO27 | | I/O (4mA) | PCIDV1 9Bh ≠ 00h | Programmable Input/Output 27 |
| DRQD/DRQ3 | L23 | I | PCIDV1 9Ch = 00h | Programmable DMA Request D/DRQ3 |
| PIO28 | | I/O (4mA) | PC1DV1 9Ch ≠ 00h | Programmable Input/Output 28 |
| DRQE/DRQ5 | L24 | I | PCIDV1 9Dh = 00h | Programmable DMA Request E/DRQ5 |
| PIO29 | | I/O (4mA) | PCIDV1 9Dh ≠ 00h | Programmable Input/Output 29 |
| DRQF/DRQ6 | L25 | I | PCIDV1 9Eh = 00h | Programmable DMA Request F/DRQ6 |
| PIO30 | | I/O (4mA) | PCIDV1 9Eh ≠ 00h | Programmable Input/Output 30 |
| DRQG/DRQ7 | L26 | I | PCIDV1 9Fh = 00h | Programmable DMA Request G/DRQ6 |
| PIO31 | | I/O (4mA) | PCIDV1 9Fh ≠ 00h | Programmable Input/Output 31 |
| DACKA#/DACK0# | K22 | O | | Programmable DMA Acknowledge A/DACK0#: DACK# is used to acknowledge DRQ to allow DMA transfer. |

TABLE 1-continued

Signal Descriptions

| Signal Name | Pin No. | Signal Type (Drive) | Selected By | Signal Description |
|---|---|---|---|---|
| PPWR4 | | | PCIDV1 C0h[2:0] = 100 | Peripheral Power Control Line 4: Peripheral power control lines 0 through 15 are latch outputs used to control external devices. |
| DACKB#/DACK1# | K23 | O | | Programmable DMA Acknowledge B/DACK1#: |
| PPWR5 | | | PCIDV1 C0h[6:4] = 100 | Peripheral Power Control Line 5 |
| DACKC#/DACK2# | K24 | O | | Programmable DMA Acknowledge C/DACK2# |
| PPWR6 | | | PCIDV1 C1h[2:0] = 100 | Peripheral Power Control Line 6 |
| DACKD#/DACK3# | K25 | O | | Programmable DMA Acknowledge D/DACK3# |
| PPWR7 | | | PCIDV1 C1h[6:4] = 100 | Peripheral Power Control Line 7 |
| DACKE#/DACK5# | K26 | O | | Programmable DMA Acknowledge E/DACK5# |
| PPWR13 | | | PCIDV1 C2h[6:4] = 100 | Peripheral Power Control Line 13 |
| DACKF#/DACK6# | J22 | O | | Programmable DMA Acknowledge F/DACK6# |
| PPWR14 | | | PCIDV1 C3h[2:0] = 100 | Peripheral Power Control Line 14 |
| DACKG#/DACK7# | J23 | O | | Programmable DMA Acknowledge G/DACK7# |
| PPWR15 | | | PCIDV1 C3h[6:4] = 100 | Peripheral Power Control Line 15 |
| Compact ISA Interface | | | | |
| SD[15:0] | AC22, AD22, | I/O (8mA) | Cycle Multiplexed | System Data Bus: SD[15:0] provides the 16-bit data path for devices residing on the ISA bus. |
| MAD[15:0] | AE22, AF22, AD23, AE23, AF23, AE24, AF24, AF25, AF26, AE25, AE26, AD24, AD25, AD26 | | | Multiplexed Address/Data Bus: Used during CISA cycles. |
| SEL/ATB# | AC20 | I/O (4mA) | PCIDV1 8Eh = 00h | Select/AT Back-off: Dedicated CISA input. |
| PIO14 | | | PCIDV1 8Eh ≠ 00h | Programmable Input/Output 14 |
| CMD# | AB20 | O (4mA) | | Command: Dedicated CISA output used to signal a data transfer command. |
| PCICLK3 | | | ROMCS#/ KBDCS# strap option | PCI Clock Output 3 |
| ATCLK | AA22 | O (8mA) | | ISA Bus Clock: This signal is derived from an internal division of PCICLK. It is used to sample and drive all ISA synchronous signals. PCIDV1 47h[5:4] sets the ATCLK: 00 = PCICLK÷4   10 = PCICLK÷2 01 = PCICLK÷3   11 = PCICLK The ATCLK is also used to demultiplex and sample externally multiplexed inputs. During Suspend, it is possible to output 32KHz on this pin, or drive it low. |
| PCICLK4 | | | ROMCS#/ KBDCS# strap option | PCI Clock Output 4 |
| IOCHRDY | AB26 | I/O (8mA) | | I/O Channel Ready: Resources on the ISA bus deassert IOCHRDY to indicate that wait states are required to complete the cycle. IOCHRDY is an input when FireStar owns the ISA bus. IOCHRDY is an output when an external ISA bus master owns the ISA bus. |
| BALE | W22 | O (8mA) | | Bus Address Latch Enable: BALE is an active high signal asserted to indicate that the address, AEN, and SBHE# signal lines are valid. BALE remains asserted throughout ISA master and DMA cycles. |
| PCICLK5 | | | ROMCS#/ KBDCS# strap option | PCI Clock Output 5 |

TABLE 1-continued

Signal Descriptions

| Signal Name | Pin No. | Signal Type (Drive) | Selected By | Signal Description |
|---|---|---|---|---|
| ISA Bus Interface | | | | |
| MRD# | AC26 | I/O (8mA) | | Memory Read: MRD# is the command to a memory slave that it may drive data onto the ISA data bus. MRD# is an output when FireStar is master on the ISA bus. MRD# is an input when an ISA master, other than FireStar, owns the ISA bus. |
| IDE1_DCS3# | | | A20M# strap option | DCS3 Control for Secondary IDE Channel |
| MWR# | AB23 | I/O (8mA) | | Memory Write: MWR# is the command to a memory slave that it may latch data from the ISA data bus. MWR# is an output when the FireStar owns the ISA bus. MWR# is an input when an ISA master, other than FireStar, owns the ISA bus. |
| IDE1_DCS1# | | | A20M# strap option | DCS1 Control for Secondary IDE Channel |
| IOR# | AB24 | I/O (8mA) | | I/O Read: IOR# is the command to an ISA I/O slave device that the slave may drive data on to the ISA data bus (SD[15:0]). The I/O slave device must hold the data valid until after IOR# is negated. IOR# is an output when FireStar owns the ISA bus. IOR# is an input when an external ISA master owns the ISA bus. |
| IDE1_DRD# | | | A20M# strap option | Drive Read Control for Secondary IDE Channel |
| IOW# | AB25 | I/O (8mA) | | I/O Write: IOW# is the command to an ISA I/O slave device that the slave may latch data from the ISA data bus (SD[15:0]). IOW# is an output when FireStar owns the ISA bus. IOW# is an input when an external ISA master owns the ISA bus. |
| IDE1_DWR# | | | A20M# strap option | D Write Control for Secondary IDE Channel |
| SMRD# | W26 | I/O (8mA) | PCIDV1 96h = 00h | System Memory Read: FireStar asserts SMRD# to request a memory slave to provide data. If the access is below the 1MB range (00000000h-000FFFFFh) during DMA compatible, IPC master, or ISA master cycles, FireStar asserts SMRD#. |
| PIO21 | | | PCIDV1 96h ≠ 00h | Programmable Input/Output 21 |
| SMWR# | V22 | I/O (8mA) | PCIDV1 97h = 00h | System Memory Write: FireStar asserts SMWR# to request a memory slave to accept data from the data lines. If the access is below the 1MB range (00000000h-000FFFFFh) during DMA compatible, IPC master, or ISA master cycles, FireStar asserts SMWR#. |
| PIO22 | | | PCIDV1 97h ≠ 00h | Programmable Input/Output 22 |
| AEN | M22 | I/O | PCIDV1 C2h[1] = 0 | Address Enable: AEN is asserted during DMA cycles to prevent I/O slaves from misinterpreting DMA cycles as valid I/O cycles. When asserted, AEN indicates to an I/O resource on the ISA bus that a DMA transfer is occurring. This signal is asserted also during refresh cycles. AEN is driven low upon reset. |
| PPWR11 | | | PCIDV1 C2h[1] = 1 | Peripheral Power Control Line 11: |
| IO16# | W23 | I/O | PCIDV1 92h = 00h | 16-Bit I/O Chip Select: This signal is driven by I/O devices on the ISA bus to indicate that they support 16-bit I/O bus cycles. |
| PIO18 | | | PCIDV1 92h ≠ 00h | Programmable Input/Output 18 |
| M16# | W24 | I/O | PCIDV1 93h = 00h | 6-Bit Memory Chip Select: ISA slaves that are 16-bit memory devices drive this signal low. MEMCS16# is an input when FireStar owns the ISA bus. FireStar drives this signal low during ISA master to PCI memory cycles. |
| PIO19 | | | PCIDV1 93h ≠ 00h | Programmable Input/Output 19 |
| RFSH# | J25 | I/O | PCIDV1 C2h[0] = 0 | Refresh: As an output, this signal is used to inform the 82C701 to refresh the local DRAM. During normal operation, a low pulse is generated every 15μs to indicate to the 82C701 that the DRAM is to be refreshed. |

TABLE 1-continued

Signal Descriptions

| Signal Name | Pin No. | Signal Type (Drive) | Selected By | Signal Description |
|---|---|---|---|---|
| | | | | During Suspend, if normal DRAM is used, the 32KHZ input to the FireStar is routed out on this pin so that the 82C701 may perform DRAM refresh. An option to continuously drive this signal low during Suspend is also provided. The internal pull-up on this pin is disengaged in Suspend. |
| PPWR12 | | | PCIDV1 C2h[0] = 1 | Peripheral Power Control Line 12 |
| SBHE# | W25 | I/O | PCIDV1 94h = 00h | System Byte High Enable: When asserted, SBHE# indicates that a byte is being transferred on the upper byte (SD[15:8]) of the data bus. SBHE# is negated during refresh cycles. SBHE# is an output when FireStar owns the ISA bus. |
| PIO20 | | | PCIDV1 94h ≠ 00h | Programmable Input/Output 20 |
| TC | M23 | I/O | PCIDV1 C2h[2] = 0 | Terminal Count |
| PPWR10 | | | PCIDV1 C2h[2] = 1 | Peripheral Power Control Line 10 |
| XD7 IDE_DCS3# | AA23 | I/O (8mA) | Cycle Multiplexed | XD Bus Line 7: ISA status signal. DCS3 Control for Primary IDE Channel |
| XD6 IDE_DCS1# | AA24 | I/O (8mA) | Cycle Multiplexed | XD Bus Line 6: ISA status signal. DCS1 Control for Primary IDE Channel |
| XD5 IDE_DDACK# | AA25 | I/O (8mA) | Cycle Multiplexed | XD Bus Line 5: ISA status signal. DMA Acknowledge for Primary IDE Channel |
| XD4 IDE_DA2 | AA26 | I/O (8mA) | Cycle Multiplexed | XD Bus Line 4: ISA status signal. Address Bit 2 for Primary IDE Channel |
| XD3 IDE_DA1 | Y23 | I/O (8mA) | Cycle Multiplexed | XD Bus Line 3: ISA status signal. Address Bit 1 for Primary IDE Channel |
| XD2 IDE_DA0 | Y24 | I/O (8mA) | Cycle Multiplexed | XD Bus Line 2: ISA status signal. Address Bit 0 for Primary IDE Channel |
| XD1 IDE_DRD# | Y25 | I/O (8mA) | Cycle Multiplexed | XD Bus Line 1: ISA status signal. Drive Read Control for Primary IDE Channel |
| XD0 IDE_DWR# | Y26 | I/O (8mA) | Cycle Multiplexed | XD Bus Line 0: ISA status signal. Drive Write Control for Primary IDE Channel |
| SA[23:20] | V23:V26, | I/O (8mA) | | System Address Bus Lines 23 through 20: The SA[23:0] signals on FireStar provide the address for memory and I/O accesses on the ISA bus. The addresses are outputs when FireStar owns the ISA bus and are inputs when an external ISA master owns the ISA bus. |
| PPWR3-0 | | | DBEW# strap option | Peripheral Power Control Lines 3 through 0 |
| SA[19:18] | U23, U24 | I/O (8mA) | | System Address Bus Lines 19 and 18 |
| PPWR9-8 | | | DBEW# strap option | Peripheral Power Control Lines 9 and 8 |
| SA[17:16] | U25, U26 | I/O (8mA) | PCIDV1 91h–90h = 00h | System Address Bus Lines 17 and 16 |
| PIO17-16 | | | PCIDV1 91h–90h ≠ 00h | Programmable Input/Output Lines 17 and 16 |
| SA[15:0] IDE1_DD15-0 | T22, T23, T24, T25, T26, R22, R23, R24, R25, R26, P23, P24, P25, P26, N22, N23 | I/O (8mA) | A20M# strap option | System Address Bus Lines 15 through 0 Disk Data Lines 15 through 0: DD15-0 provide the 16-bit data path for the IDE disk drives. |
| External Real-Time Clock Interface | | | | |
| RTCAS | N24 | O (4mA) | | Real-Time Clock Address Strobe: This signal is connected to the address strobe of the real-time clock. |
| IDE1_DA0 | | I/O | A20M# strap option | Address Bit 0 for Secondary IDE Channel |

TABLE 1-continued

Signal Descriptions

| Signal Name | Pin No. | Signal Type (Drive) | Selected By | Signal Description |
|---|---|---|---|---|
| RTCRD# | N25 | O (4mA) | | Real-Time Clock Read: This pin is used to drive the read signal of the real-time clock. |
| IDE1_DA1 | | I/O | A20M# strap option | Address Bit 1 for Secondary IDE Channel |
| RTCWR# | N26 | O (4mA) | | Real-Time Clock Write: This pin is used to drive the write signal of the real-time clock. |
| IDE1_DA2 | | I/O | A20M# strap option | Address Bit 2 for Secondary IDE Channel |
| Power Management Unit Interface | | | | |
| PPWRL | AC23 | O (4mA) | | Power Control Latch: This signal is used to control the external latching of the peripheral power control signals PPWR0-15. This signal is pulsed after reset to preset the external latch. |
| PPWR0# | | I/O | PPWRL strap option | Peripheral Power Control Line 0# |
| Miscellaneous | | | | |
| A20M# | R3 | O (4mA) | | Address Bit 20 Mask: This pin is an output and generates the A20M# output by trapping GATEA20 commands to the keyboard or to Port 092h. The CPUINIT signal to the CPU is generated whenever it senses reset commands to Port 060h/064h, or a Port 092h write command with bit 0 set high.<br>When keyboard emulation is disabled, the 82C700 traps only Port 092h GATEA20 commands and accepts the GATEA20 input from the keyboard controller, which is sent out as A20M# to the CPU. |
| ROMCS# | J24 | O (4mA) | | BIOS ROM Chip Select: This output goes active on both reads and writes to the ROM area to support flash ROM. For flash ROM support, writes to ROM can be supported by appropriately setting PCIDV1 47h[7]. |
| PIO23 | | I/O (4mA) | | Programmable Input/Output Line 23 |
| ROMCS#+ KBDCS# | | O (4mA) | PCIDV1 4Fh[1] = 1 | Combined ROM and Keyboard Chip Select: When this combined functionality is selected, the ROM cycles are qualified by MRD#/MWR#; the keyboard controller cycles are qualified by IOR#/IOW#. |
| SPKROUT | H23 | I/O (8mA) | | Speaker Data: This pin is used to drive the system board speaker. This signal is a function of the Timer-0 Counter-2 and Port 061h bit 1.<br>Can use CISA protocol to gang several. |
| KBDCS# | J26 | O (8mA) | Default | Keyboard Chip Select: Used to decode accesses to the keyboard controller. |
| PIO24 | | I/O (8mA) | | Programmable Input/Output 24 |
| DRD# | | O (8mA) | PCIDV1 4Fh[1] = 1 | Drive Read Signal |

Boundary Scan Signal Set

JTAG Boundary Scan

| TCK | A8 | I | | Test Clock |
|---|---|---|---|---|
| TDI | B7 | I | | Test Data In |
| TDO | A7 | O (4mA) | | Test Data Out |
| TMS | D7 | I | | Test Mode Select |

Note: TRST#: Test Reset is shared with the PWRGD input.

Reserved, Power and Ground Pins

| Signal Name | Pin No. | Signal Type | Signal Description |
|---|---|---|---|
| RSV | AB5, E22 | NC | Reserved: These pins should remain unconnected. |
| GND | AA6, AA13, AA14, AA21, AB13, E14, F6, F13, | G | Ground Connections |

TABLE 1-continued

Signal Descriptions

| Signal Name | Pin No. | Signal Type (Drive) | Selected By | Signal Description |
|---|---|---|---|---|
| VCC_ISA | F14, F21, N5, N6, N21, P6, P21, P22, L22, U22, Y22 | P | | ISA Bus Power Plane: 3.3V or 5.0V |
| VCC_CPU | AB19, E8, G5, H22, K5, T5, W5 | P | | CPU Bus and FireStar Core Power Plane: 3.3V only |
| VCC_DRAM | E11, E17, E20 | P | | Memory Power Plane: 3.3V or 5.0V |
| VCC_PCI | AB7, AB10, AB16 | P | | PCI Bus Power Plane: 3.3V or 5.0V |
| 5VREF | AB21, E7 | P | | 5.0 V Reference: Connect to 5.0V is available in the system. |

As shown in Table 1, several pins are programmable, and specifically those labeled PIO0-31. Each PIO pin is shown with a paired signal in Table 1. The paired signal is the default signal. For instance, PIO1 shown in Table 1 at pin A10 is paired with TAGWE#. When the system is powered-up, PIO1 defaults to carry the signal TAGWE# on pin A10. Nonetheless, the default value can be changed by programming.

As shown in Table 1, the signal carried on pin A10 is selected by a register entitled "PCIDV1 81h". When powered up, PCIDV1 81h defaults to store the value 00h, where "h" indicates a hexadecimal number. Yet, if the value in register PCIDV1 81h is anything other than 00h, pin A10 will carry a different signal.

Any of the PIO pins PIO0-31 can take on any of a plurality of functions, which total over 70 in one embodiment of the invention. The functions available for programming any of the PIO pins in one embodiment of the invention are listed in Table 2 below.

TABLE 2

PIO Functions

| Group | Function | function No. | Description |
|---|---|---|---|
| Power Management Inputs Group 0 | Default on pin | 0h | Pin definition at reset |
| | EPMI1# | 1h | External Power Management Input 1 |
| | EPMI2# | 2h | External Power Management Input 2 |
| | EPMI3# | 3h | External Power Management Input 3 |
| | EPMI4# | 4h | External Power Management Input 4 |
| | LOBAT | 5h | Low Battery SMI (periodic) |
| | LLOBAT | 6h | Very Low Battery SMI (level-triggered) |
| | RI | 7h | Ring Indicator |
| | SUS/RES# | 8h | Suspend/Resume |
| | THMIN | 9h | |
| | HDI | Ah | ISA Hot Docking Indicator |
| | TEMPDET | Bh | Temperature Detect Input for thermal mgmt. |
| | Reserved | C-Fh | |

TABLE 2-continued

PIO Functions

| Group | Function | function No. | Description |
|---|---|---|---|
| Power Control Outputs Group 1h | PPWRx | 0-Fh | Peripheral Power Control Outputs, x = 0 ... 15 |
| Misc. Inputs Group 2h | PCIRQ0-3# | 0-3h | PCI Interrupts |
| | DDRQ1 | 4h | IDE Cable 1 DMA Request |
| | CHRDYA | 5h | Dedicated IDE Cable 0 Channel Ready |
| | CHRDYB | 6h | Dedicated IDE Cable 1 Channel Ready |
| | MSTR# | 7h | ISA MASTER# signal |
| | CHCK# | 8h | ISA IOCHCK# signal (generates NMI) |
| | KBCRST | 9h | Reset signal from Keyboard Controller |
| | KBCA20M# | Ah | A20M# signal from Keyboard Controller |
| | Monitor Input | Bh | PIO pin becomes input; read at PCIDV1 A8-ABh |
| | NOWS# | Ch | ISA zero walt state signal |
| | Reserved | D-Fh | |
| Misc. Outputs Group 3h | GPCSx# | 0-3h | General Purpose Chip Select outputs, x = 0–3 |
| | Reserved | 4-7h | |
| | CDIR | 8h | Compact ISA Cable Buffer Direction signal |
| | L2CLKOE | 9h | L2 Cache Clock Output Enable |
| | PCICLKOE | Ah | PCI Clock Output Enable (to ext. clock generator) |
| | HGNT# | Bh | UMA Split Buffer Contol signal |
| | Reserved | C-Fh | |
| IDE Controller Outputs Group 4h | DDACK0# | 0h | Dedicated IDE DMA acknowledge |
| | DDACK1# | 1h | |
| | DRD# | 2h | Dedicated IDE Command |
| | DWR# | 3h | |
| | DCS1# | 4h | Dedicated IDE Chip Select |
| | DCS3# | 5h | |
| | DA0 | 6h | Dedicated IDE address |
| | DA1 | 7h | |
| | DA2 | 8h | |
| | DBEX# | 9h | IDE Buffer Control for Drive X |

TABLE 2-continued

PIO Functions

| Group | Function | function No. | Description |
|---|---|---|---|
| | DBEY# | Ah | IDE Buffer Control for Drive Y |
| | DBEZ# | Bh | IDE Buffer Control for Drive Z |
| | Reserved | C-Fh | |
| Gate Logic Inputs Group 5h | AND Input 1 | 0h | 3-Input AND Gate |
| | AND Input 2 | 1h | |
| | AND Input 3/ NAND Input 1 | 2h | |
| | NAND Input2 | 3h | 3-Input NAND Gate |

TABLE 3

Register Programmable PIO Pins

| 7 | 6 | 5 | 4 | 3 | 2 | 1 | 0 |
|---|---|---|---|---|---|---|---|
| PCIDV1 BDh | | | PIO0 Pin Function Register | | | | Default = 00h |
| Tristate, pull-down PIO pin during Suspend: 0 = No 1 = Yes | 000 = Group 0 (Power Management Inputs) 001 = Group 1 (Power Contol Outputs) 010 = Group 2 (Miscellaneous Inputs) 011 = Group 3 (Miscellaneous Outputs) 100 = Group 4 (IDE Controller Outputs) 101 = Group 5 (Gate Logic Inputs) 110 = Group 6 (Logic Outputs) 111 = Group 7 (Reserved) | | | 0000 = Group function 0 0001 = Group function 1 0010 = Group function 2 0011 = Group function 3 0100 = Group function 4 0101 = Group function 5 0110 = Group function 6 0111 = Group function 7 | | 1000 = Group function 8 1001 = Group function 9 1010 = Group function 10 1011 = Group function 11 1100 = Group function 12 1101 = Group function 13 1110 = Group function 14 1111 = Group function 15 | |

TABLE 2-continued

PIO Functions

| Group | Function | function No. | Description |
|---|---|---|---|
| | NAND Input 3/ OR Input 1 | 4h | 3-Input OR Gate |
| | OR Input 2 | 5h | |
| | OR Input 3 | 6h | |
| | XOR Input 1 | 7h | 3-Input XOR Gate |
| | XOR Input 2 | 8h | |
| | XOR Input 3 | 9h | |
| | FF1 PRE# Input | Ah | First D Flip-Flop |
| | FF1 D Input | Bh | |
| | FF1 CLK Input | Ch | |
| | FF1 CLR# Input | Dh | |
| | FF2 D input | Eh | Second D Flip-Flop |
| | FF2 CLK Input | Fh | |
| Logic Outputs Group 6h | Logic 0 | 0h | |
| | Logic 1 | 1h | |
| | AND output | 2h | |
| | NAND output | 3h | |
| | OR output | 4h | |
| | XOR output | 5h | |
| | FF1 Q output | 6h | |
| | FF2 Q output | 7h | |
| | Reserved | 8-Fh | |

As shown in Table 2, functions are grouped into seven groups, groups 0–6, where group 0 is power management inputs, group 1 is power control outputs, group 2 is miscellaneous inputs, group 3 is miscellaneous outputs, group 4 is IDE controller outputs, group 5 is gate logic inputs, and group 6 is logic outputs. Within each group are a plurality of functions, each assigned a function number. Thus, each function is identified by Group number and by function number.

To program each pin to accept signals corresponding to any of the functions identified in Table 2, each of the 32 PIO pins has an associated 8-bit register. For example, Table 3 below, shows the register PCIDV1 80h for PIO0. Bits 6:4 are used to select the function group (Table 2). Bits 3:0 are used to select the specific function within each group. Bit 7 is used to select how the pin will behave during a low power mode, e.g., "suspend." In bit 7, if a 1 is selected, the pin will tri-state in low power mode, while if a 0, the pin will be pulled down in low power mode. Although only the register associated with PIO0 is shown in Table 3, each PIO pin PIO0-31 has its own associated 8-bit register similar to that shown in Table 3.

The ability to program 32 pins, each with any of 70 functions allows the user of the chip, e.g., laptop vendors, to customize the chip according to the user's particular needs. For example, a certain user system design might require a nearly complete ISA bus, but without the need for the M16# pin because no ISA memory would be supported. The PPWR6 function (Group 1—Power Control Outputs) could be assigned to replace the M16# pin without disturbing the rest of the ISA interface by simply programming PCIDV1 93h=16h (M16# corresponds to PIO19). A setting of 16h selects the power control outputs group (1h) and the PPWR6 as a function (6h).

Figure 4:
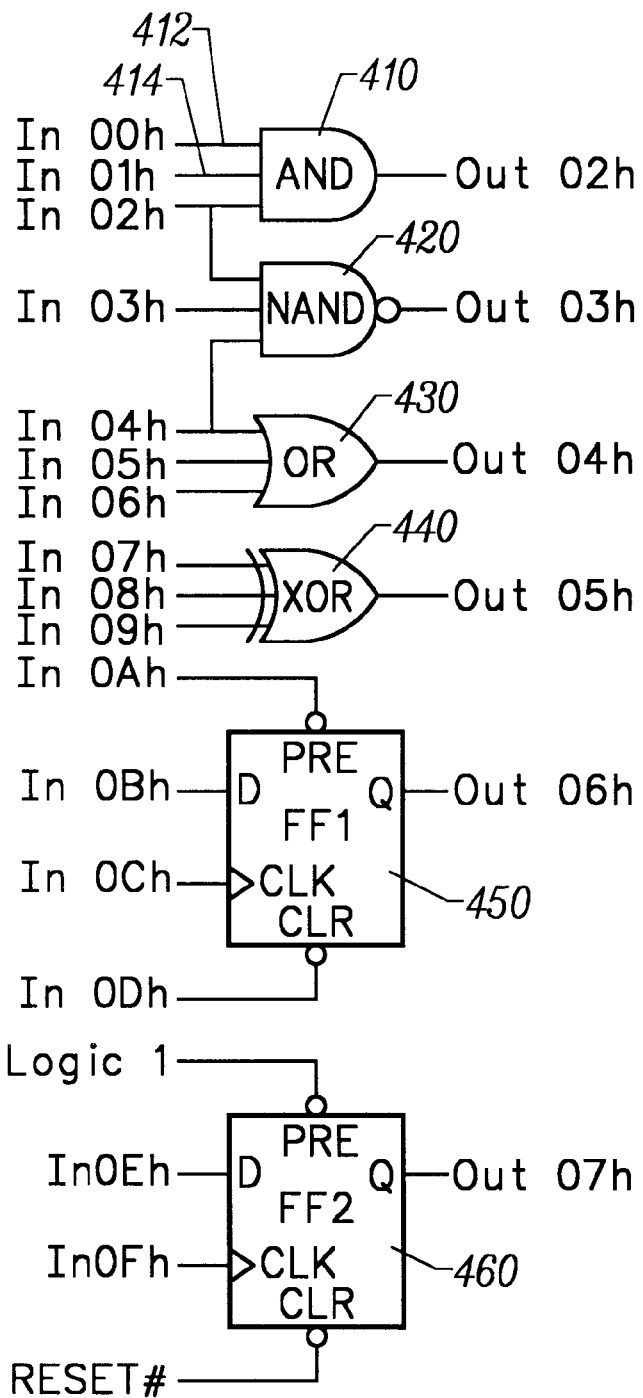
FIG. 4 is a block diagram of programmable gate functions available in one embodiment of the invention.

PIO pins can also take on logical gate functions, as indicated by groups 5 and 6 of Table 2. The gate functions available in one embodiment are shown in FIG. 4 and include AND 410, NAND 420, OR 430, and XOR 440 gates as well as two flip-flops 450 and 460. Each PIO pin can assume the function of an input or an output to each of the gates shown in FIG. 4. For instance, if it is desired that PIO10 assume the function of XOR input 1, the register for PIO10 will contain the following data: X1010111 (where X is a "don't care" value).

Not only can the gate inputs and outputs shown in FIG. 4 be connected directly to PIO pins, but they can also be connected to each other for multi-level logic development, e.g., XOR 440 output can be internally "connected" to an OR 430 input. Such internal "connections" are also made through the use of registers such as that shown in Table 4:

TABLE 4

Gate Matrix Programming Registers

| 7 | 6 | 5 | 4 | 3 | 2 | 1 | 0 |
|---|---|---|---|---|---|---|---|
| PCIDV1 A0h | | | Logic Matrix Register 1 | | | | Default = 00h |
| Invert input 01h | Connect logic input 01h (AND2) to: | | | Invert input 00h | | Connect logic input 00h (AND1) to: | |
| (whether from PIO pin or from logic matrix output)? 0 = No 1 = Yes | 000 = PIO pin 001 = Logic 1 010 = Out 2h (AND output) 011 = Out 3h (NAND output) 100 = Out 4h (OR output) 101 = Out 5h (XOR output) 110 = Out 6h (flip-flop 1 output) 111 = Out 7h (flip-flop 2 output) | | | (whether from PIO pin or from logic matrix output)? 0 = No 1 = Yes | | 000 = PIO pin 001 = Logic 1 010 = Out 2h (AND output) 011 = Out 3h (NAND output) 100 = Out 4h (OR output) 101 = Out 5h (XOR output) 110 = Out 6h (flip-flop 1 output) 111 = Out 7h (flip-flop 2 output) | |

Each input to the gates shown in FIG. 4 (AND 1, AND 2, AND 3, NAND, OR1, OR2, OR3, XOR1, XOR2, XOR3, flip-flop1 PRE# input, flip-flop1 D-input, flip-flop1 CLK input, flip-flop1 CLR# input, flip-flop2 D-input, and flip-flop2 CLK input) receives four bits in an 8-bit register. For instance, register PCIDV1 A0h is shown in Table 4 and stores the connections for AND gate 410 input 1 412 and AND gate 410 input 2 414. Either of these inputs can be "connected" to the PIO pin directly or to any of the gate inputs by programming the register as shown in Table 4. By using a programmable logic matrix formed by the registers such as that shown in Table 4, the number of external logic devices can be minimized by recovering unused PIO pins. In one embodiment of the invention, eight Logic Matrix Registers like that shown in Table 4 are utilized.

While seventy functions are available for programming on any PIO pin, the signals chosen for the programmable function pool (i.e., Table 2) are selectively chosen. Typically these functions do not require speed critical signals. Moreover, these functions as well as the paired default signal functions are chosen with knowledge of the various platforms in which a chipset in accordance with the invention may be used so as to minimize wasted pins for all vendors.

In operation, on power-up of a system including a chipset in accordance with the invention, the PIO pins will first take on their default functions. The user will program the registers corresponding to the PIO pins if the user desires any changes in functionality from the default—in other words, programming is dynamic. Such programming can be done by a BIOS ROM (170 in FIG. 1) during system boot or can be done "on the fly" later during system operation.

As described above, a system in accordance with the invention is implemented in a single chip chipset. Nonetheless, other embodiments of the invention could be implemented in a multi-chip chipset or even in a non-chipset environment. Furthermore, while programmable IO pins have been provided in other systems, typically such pins only permit multiplexed selection between two signals and occasionally three signals. Additionally, programmable pins in conventional systems typically have different signals to select from than their counterparts—the programmable pins do not share a function pool. However, as provided by the invention, selection among functions in a large function pool of PIO pins will provide a system with considerable flexibility not previously seen in the chipset arena. Moreover, while other conventional methods, specifically PLD technology, have provided chip programming to allow various logic functions to be performed and results output, such technology does not permit dynamic pin programming, and particularly, does not generally provide the ability to program pins without structurally altering the chip itself, e.g., by fusing lines, unlike the present invention.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. An integrated circuit, comprising:

a plurality of programmable pins, wherein each pin is dynamically programmable to carry any of a plurality of signals defined by any one of a plurality of functions; and a plurality of registers, wherein each respective register in said plurality of registers is associated with a respective one of said plurality of programmable pins, wherein each respective one of said programmable pins is programmed by storing a function identifier associated with any one of said plurality of functions in said respective associated register.

2. The integrated circuit of claim 1, wherein said plurality of functions includes more than four functions.

3. The integrated circuit of claim 2, wherein said plurality of functions includes power management and control functions;

IDE control functions;

gate level functions; and address decode functions.

4. The integrated circuit of claim 2, wherein said plurality of functions includes 70 functions.

5. A chipset for use in a PC-type system for interfacing between a host bus and a system bus, comprising:

only one chip;

said one chip having a plurality of I/O pins;

said one chip having a plurality of dynamically programmable registers, wherein each respective register in said plurality of registers is associated with a respective one of said plurality of said I/O pins, wherein each register can be dynamically programmed to store a function identifier associated with any function in a plurality of functions, wherein when a register in said plurality of registers is so programmed, the I/O pin associated with said register carries signals corresponding to the function identified by said function identifier.

6. The chipset of claim 5, wherein the number of functions in said plurality of functions is greater than four.

7. The chipset of claim 6, wherein the number of functions in said plurality of functions is approximately 70.

* * * * *